United States Patent
Tanaka

(10) Patent No.: US 8,026,448 B2
(45) Date of Patent: Sep. 27, 2011

(54) MULTILAYER WIRING BOARD AND METHOD OF MANUFACTURING THE SAME

(75) Inventor: Koichi Tanaka, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 861 days.

(21) Appl. No.: 12/068,169

(22) Filed: Feb. 4, 2008

(65) Prior Publication Data
US 2008/0185175 A1 Aug. 7, 2008

(30) Foreign Application Priority Data
Feb. 6, 2007 (JP) .................. 2007-026540

(51) Int. Cl.
*H05K 1/03* (2006.01)
(52) U.S. Cl. .......... 174/255; 174/261; 174/262
(58) Field of Classification Search .......... 174/254, 174/255, 260, 261, 262
See application file for complete search history.

(56) References Cited

U.S. PATENT DOCUMENTS

| 3,702,500 | A | * | 11/1972 | Gorinas et al. | 29/857 |
| 5,471,090 | A | * | 11/1995 | Deutsch et al. | 257/734 |
| 6,429,112 | B1 | | 8/2002 | Smith et al. | 438/611 |
| 7,186,920 | B2 | * | 3/2007 | Takeuchi | 174/254 |

FOREIGN PATENT DOCUMENTS

| DE | 100 13 483 | 9/2001 |
| EP | 0 615 290 | 9/1994 |
| JP | 8-125344 | 5/1996 |
| JP | 8-195561 | 7/1996 |

OTHER PUBLICATIONS

European Search Report dated Sep. 28, 2009.

* cited by examiner

*Primary Examiner* — Ishwarbhai Patel
(74) *Attorney, Agent, or Firm* — Kratz, Quintos & Hanson, LLP

(57) ABSTRACT

A multilayer wiring board includes at least two wiring boards having wiring layers containing wiring patterns formed on both sides. A pair of fin-shaped bumps are formed at desired positions on wiring patterns on the surfaces facing each other, of the wiring boards, so that the bumps assume a slender shape as seen in plan view and that the bumps intersect each other. The pair of fin-shaped bumps are electrically connected to form an inter-board connection terminal. Further, an insulating layer is formed between the wiring boards, and protection films are formed to cover the entire surface except pad areas defined at predetermined positions on outer wiring layers of the wiring boards.

4 Claims, 8 Drawing Sheets

PATTERN PLAN VIEW

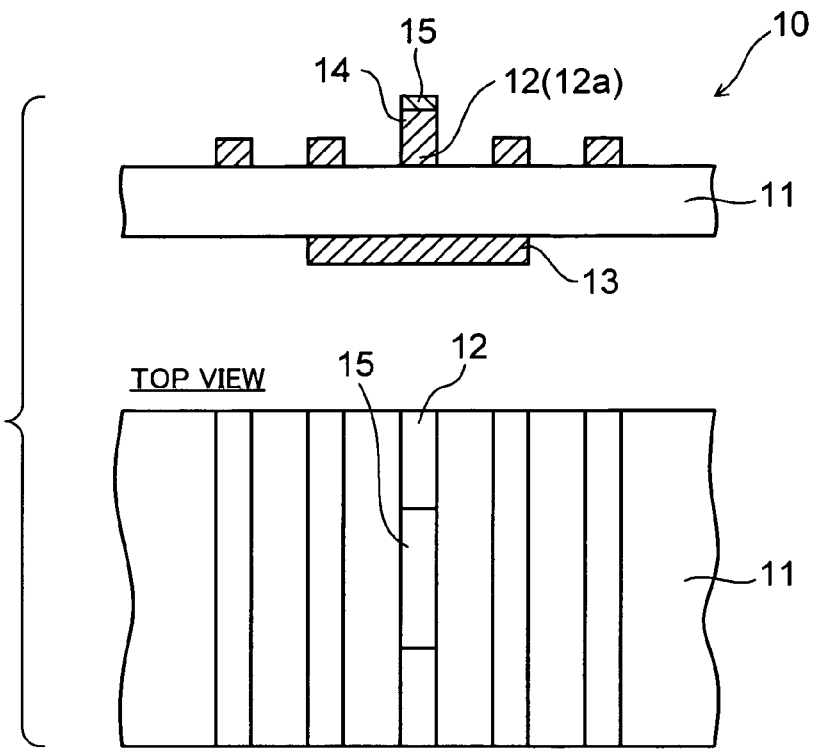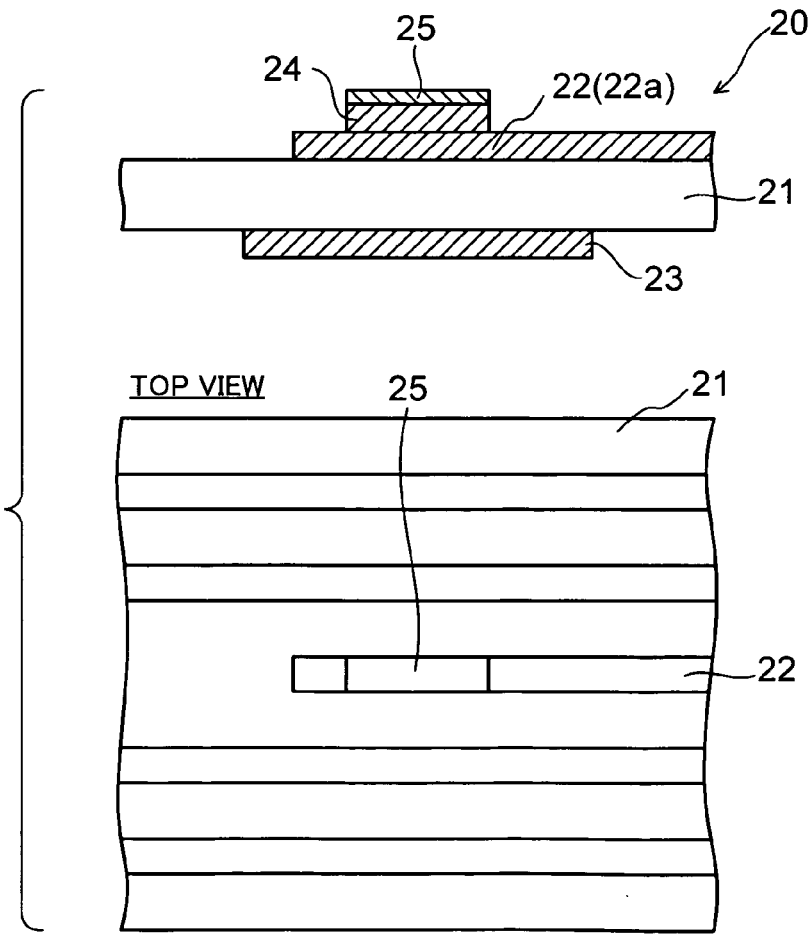

MULTILAYER WIRING BOARD AND METHOD OF MANUFACTURING THE SAME

CROSS-REFERENCE TO RELATED APPLICATIONS

This application is based on and claims priority of Japanese Patent Application No. 2007-026540 filed on Feb. 6, 2007, the entire contents of which are incorporated herein by reference.

BACKGROUND OF THE INVENTION (a) Field of the Invention

The present invention relates to a technique of manufacturing a wiring board for use in mounting of a chip component such as a semiconductor device, and more particularly to a multilayer wiring board having a multilayer structure adapted to achieve high density and a method of manufacturing the same.

(b) Description of the Related Art

To fabricate a wiring board of multilayer structure formed of a plurality of wiring boards stacked up with an insulating adhesive layer such as prepreg being provided therebetween, various approaches and technologies have been heretofore used as methods of interconnecting wiring patterns formed on the wiring boards. For example, FIG. 7A shows one of the methods. In this method, two wiring boards 1 and 2 each having wiring patterns formed on both sides are first stacked up with an insulating layer 3 (e.g., prepreg) sandwiched therebetween. Then, a through hole TH is formed in the stacked boards at a desired position by means of mechanical drilling or the like. Thereafter, electroplating is performed in the through hole TH (i.e., a conductor layer is formed), so that the wiring patterns on the wiring boards are interconnected through the conductor layer. Another method is to use B2IT (Buried Bump Interconnection Technology) for interconnecting the patterns between the boards. FIG. 7B shows an example of the method using B2IT. Conductive paste such as solder is first fed onto a wiring pattern of one board 5 by means of screen printing. The conductive paste is melted into a bump (namely, a solder bump 6) by means of reflow. Then, the solder bump 6 is press-bonded through a prepreg layer 7 to a wiring pattern of the other board 8. Still another method is to form gold (Au) bumps, copper (Cu) posts, or the like, on wiring patterns of wiring boards, thereby interconnecting the boards through a conductive material such as solder.

In any of the cases where these approaches and technologies are used for an interconnection between boards, misalignment, inaccuracy in fabrication, or the like, involved in stacking of the boards, must be taken into consideration. Accordingly, as shown in FIGS. 7A and 7B, connection pads 4 and 9 are formed at desired positions on the wiring patterns of the boards in such a manner as to have sizes larger than the diameters of the through hole TH and the bump 6 for use in the interconnection. The wiring patterns of the boards are thus electrically interconnected with their corresponding wiring patterns through the connection pads.

Japanese unexamined Patent Publication (JPP) (Kokai) 8-195561 describes one of the techniques related to the above prior art. In this technique, a multilayer printed wiring board includes a conductive bump formed of a synthetic resin in truncated cone form, fixedly bonded, at a first bottom face thereof on the small area side, to an outer pad, while being fixedly bonded, at a second bottom face thereof on the large area side, to copper foil of an inner conductor disposed inside, and formed of a laminate of synthetic resin sheet bases.

Another related art is disclosed in JPP (Kokai) 8-125344. In this technique, a method of manufacturing a printed wiring board includes forming a desired conductive pattern on the surface of an insulating substrate; forming a conductive bump at a predetermined position on the surface of the conductive pattern; and then press-bonding copper foil to the surface having the conductive bump formed thereon, with an insulating adhesive resin layer being provided therebetween, in which the conductive bump is connected at the end through the insulating adhesive resin layer to the surface of the copper foil opposite to the bump.

As mentioned above, the conventional manufacturing technology for a multilayer wiring board adopts the through hole (and plating in the through hole), the solder bump, the Au bump, the Cu post, or the like, as means for interconnecting the boards (or the wiring patterns). However, any means requires a circular connection pad of appropriate size (e.g., the connection pads 4 and 9 shown in FIGS. 7A and 7B), allowing for the misalignment, the inaccuracy in fabrication, or the like, involved in the stacking of the wiring boards.

However, such a connection pad forms a bottleneck in high-density wiring under recent circumstances where a wiring pitch on board has become small. Specifically, an area occupied by the connection pads is becoming relatively large, resulting in a problem in that the connection pad 9 causes an obstruction to wiring, for example, as shown in FIG. 8, due to being bottlenecked on its size. A part WS indicated by a dashed line in FIG. 8 is a schematic representation of the wiring as not routed due to the size of the connection pad 9. The connection pad is disadvantageous in the high-density wiring, because higher wiring density, in particular, leads to a higher percentage of occupation by the connection pads (specifically, a larger area occupied by the connection pads and also a larger number of connection pads installed).

Also encountered is a problem in that the connection pad does not necessarily provide an electrical interconnection between the boards (or the wiring patterns) therethrough, depending on the degree of misalignment or the like. This is because, although being formed in the appropriate size allowing for the misalignment or the like involved in the stacking, the connection pad has the limit to the "appropriate size" permitted to be designed in view of accuracy such as misalignment under the state of the art.

SUMMARY OF THE INVENTION

An object of the present invention is to provide a multilayer wiring board and a method of manufacturing the same, which enable high-density wiring and enable ensuring an electrical interconnection between boards even at occurrence of some misalignment or the like when stacking.

In order to attain the above object, according to one aspect of the present invention, there is provided a multilayer wiring board including: at least two wiring boards stacked up; a pair of fin-shaped bumps formed at desired positions on wiring patterns on the surfaces facing each other, of the wiring boards, in such a manner that each bump assumes a slender shape as seen in plan view, and that the bumps intersect each other, the pair of fin-shaped bumps being electrically connected to form an inter-board connection terminal; and an insulating layer formed between the wiring boards.

According to the configuration of the multilayer wiring board according to this aspect, when stacking a plurality of wiring boards, the fin-shaped bumps formed on the wiring patterns on the surfaces facing each other, of the wiring boards are bonded together in overlapping relationship in such a manner as to cross each other, to thereby form an integral structure of the bumps, which in turn is used to provide an electrical connection between the wiring boards therethrough. In short, a pair of the fin-shaped bumps are used as means for providing an interconnection between the boards.

This configuration eliminates the need for the circular connection pads (designated by reference numerals 4 and 9 in FIGS. 7A and 7B) required for the interconnection between the boards such as seen in the prior art, and hence enables eliminating such a disadvantage (incapability of wiring routing, as represented by the part WS indicated by the dashed line in FIG. 8) as encountered in the prior art. This contributes to achievement of high-density wiring, because of making it possible to route wiring patterns closely adjacent to the fin-shaped bump, for example, as shown in FIGS. 1A and 1B.

Moreover, the fin-shaped bumps that form the inter-board connection terminal have the slender shape as seen in plan view and also overlap each other in such a manner as to cross each other. This makes it possible to ensure an electrical connection somewhere on the bumps having the "slender shape," even at occurrence of some misalignment or the like when stacking the wiring boards.

Also, in order to attain the above object, according to another aspect of the present invention, there is provided a method of manufacturing a multilayer wiring board, including the steps of: stacking up first and second wiring boards each having formed thereon a fin-shaped bump assuming a slender shape as seen in plan view, so that the fin-shaped bumps intersect each other, thereby providing an electrical connection between the fin-shaped bumps; and filling resin into a gap between the first wiring board and the second wiring board.

Detailed description will be given with reference to embodiments of the present invention to be described later, with regard to other features in configuration and process, and the like, of the multilayer wiring board and the method of manufacturing the same according to the present invention.

BRIEF DESCRIPTION OF THE DRAWINGS

FIGS. 4A and 4B are cross-sectional views (partly in top view) showing steps following the steps shown in FIGS. 3A to 3C;

DESCRIPTION OF THE PREFERRED EMBODIMENTS

Description will be given below with regard to preferred embodiments of the present invention with reference to the accompanying drawings.

Figure 1A:
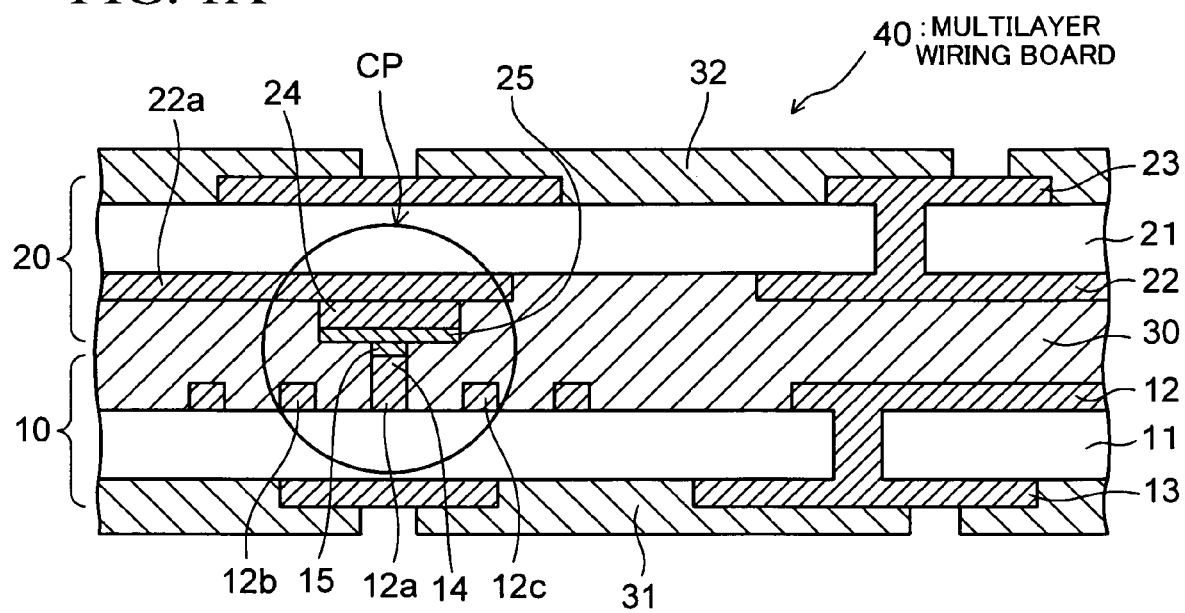
FIGS. 1A and 1B are views showing the configuration of a multilayer wiring board according to an embodiment of the present invention, and are a cross-sectional view thereof and a plan view showing the configuration of a principal part thereof (i.e., a cross post section), respectively.
Figure 1B:
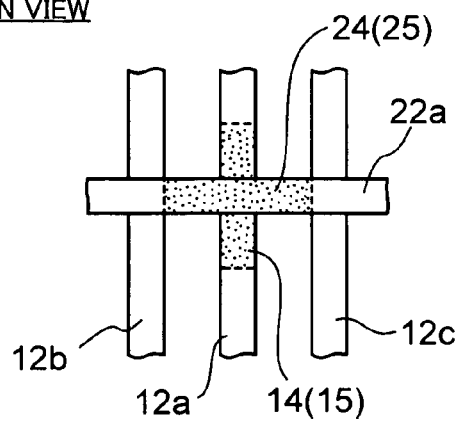

FIGS. 1A and 1B show the configuration of a multilayer wiring board according to an embodiment of the present invention. FIG. 1A shows its structure in cross section, and FIG. 1B shows, in plan view, the configuration (or pattern) of its principal part (specifically a circled part indicated by reference character CP in FIG. 1A, namely, a "cross post section" to be described later).

As shown in FIG. 1A, the multilayer wiring board 40 according to the embodiment includes two wiring boards 10 and 20 stacked up vertically, an insulating layer 30 formed to be filled between the wiring boards 10 and 20, and insulating layers 31 and 32 functioning as protection films formed on the outermost layers of the board 40. The wiring boards 10 and 20 have resin substrates 11 and 21 as base members, and on both sides thereof, wiring layers 12 and 13 and wiring layers 22 and 23 are formed respectively, containing wiring patterns formed by means of patterning in desired shapes. Also, bumps 14 and 24 shaped like fish's fins are formed as standing in a stacking direction at desired positions on wiring patterns 12a and 22a on the surfaces facing each other, of the wiring boards 10 and 20. Further, conductive materials 15 and 25 are deposited on the tops of the bumps 14 and 24, respectively. Hereinafter, the bumps 14 and 24 will be also called "fin-shaped bumps" for the sake of convenience since they look like the "fins," and moreover, the lower one of the wiring boards 10 and 20 stacked up will be also called a "lower wiring board" and the upper one will be also called an "upper wiring board."

As shown schematically in FIG. 1B, the fin-shaped bumps 14 and 24, as seen in plan view, assume a "slender shape" in such a manner as to be superposed on the wiring patterns 12a and 22a, respectively, and intersect each other in the shape of a cross. In other words, the fin-shaped bumps 14 and 24 are formed so that the bumps intersect each other as seen in plan view when the lower wiring board 10 and the upper wiring board 20 are stacked up. When stacked, the bumps 14 and 24 are bonded together (or electrically connected) to form the "cross post section CP" by which the present invention is characterized. Then, the cross post section CP (formed of a pair of the fin-shaped bumps 14 and 24) functions as an inter-board connection terminal. Incidentally, although the fin-shaped bumps 14 and 24 intersect each other "crosswise" as shown in FIG. 1B, the bumps 14 and 24 do not necessarily have to intersect each other precisely "crosswise" but may take any form, provided that they intersect each other nearly in the form of a cross.

The insulating layers 31 and 32 functioning as protection films are formed to cover the entire surface except pad areas defined at predetermined positions on the outer wiring layers 13 and 23 of the lower wiring board 10 and the upper wiring board 20. Electrode terminals of a chip component mounted on the board 40 such as a semiconductor device are connected via solder bumps or the like to the pad areas exposed from the upper insulating layer 32, and metal bumps (or balls), metal pins, or the like, which function as external connection terminals for use in packaging of the board 40 on a motherboard or the like, are bonded via solder or the like to the pad areas exposed from the lower insulating layer 31.

The resin substrates 11 and 21 that constitute the base members of the wiring boards 10 and 20 can take any form, provided that each substrate has conductor layers formed on at least the outermost layers, and that the conductor layers are electrically connected through the inside of the substrate. The resin substrates 11 and 21 may take the form of having wiring layers formed therein or having no wiring layers formed therein. Where the resin substrate takes the form of having the wiring layers formed therein, the conductor layers on the outermost layers are electrically connected through the wiring layers formed in the substrate with an insulating layer provided therebetween and a via hole through which the wiring layers are interconnected, which is not specifically shown since this is not a part that characterizes the present invention. The boards in this form include, for example, a wiring board of multilayer structure that can be formed by use of a build-up process. On the other hand, where the resin substrate takes the form of having no wiring layers formed therein, the conductor layers on the outermost layers are electrically connected via a through hole appropriately formed in the resin substrate at a desired position. The boards in this form include, for example, a core board that corresponds to a base member of the above-mentioned multilayer wiring board formed by use of the build-up process.

As also shown in FIGS. 1A and 1B, the multilayer wiring board 40 according to the embodiment is characterized in that the cross post section CP is used to provide an electrical interconnection between the stacked wiring boards 10 and 20 therethrough. Specific descriptions will be given with regard to materials, sizes, and others for structural members that constitute the multilayer wiring board 40 according to the embodiment, in connection with a process to be described later.

Incidentally, although the two wiring boards 10 and 20 are stacked up to form the multilayer wiring board 40 as shown in FIGS. 1A and 1B for the sake of simplicity of explanation, it is to be, of course, understood that the number of wiring boards to be stacked is not limited to two. Although not specifically shown, to stack up three or more wiring boards, a pair of fin-shaped bumps are formed likewise at desired positions on wiring patterns on the surfaces facing each other, of the wiring boards stacked adjacent to each other, to thereby form a cross post section that characterizes the present invention. When stacking, the cross post section is used to provide an electrical interconnection between the boards therethrough.

Description will be given below with regard to a method of manufacturing the multilayer wiring board 40 according to the embodiment with reference to FIGS. 2A to 5B showing, in sequence, manufacturing steps in the method. Incidentally, only parts related to the present invention (namely, the cross post section CP and its periphery) are shown in these drawings (i.e., cross-sectional views, top views, and a plan view) for the sake of simplicity of illustration. Also, the manufacturing steps for the lower wiring board 10 alone are shown as a representative in the process drawings of FIGS. 2A to 2C and FIGS. 3A to 3C for the sake of simplicity of illustration, since the lower wiring board 10 and the upper wiring board 20 can be fabricated through the same process.

Figure 2A:
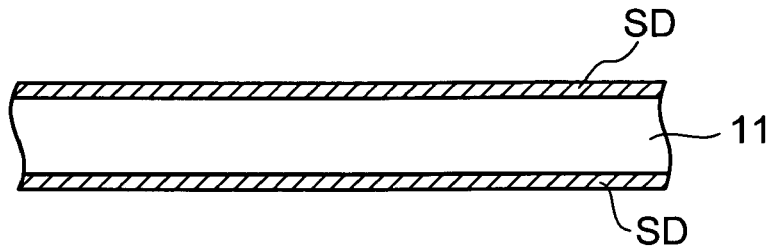
FIGS. 2A to 2C are cross-sectional views (partly in top view) showing steps in a method of manufacturing the multilayer wiring board shown in FIGS. 1A and 1B.
Figure 2B:
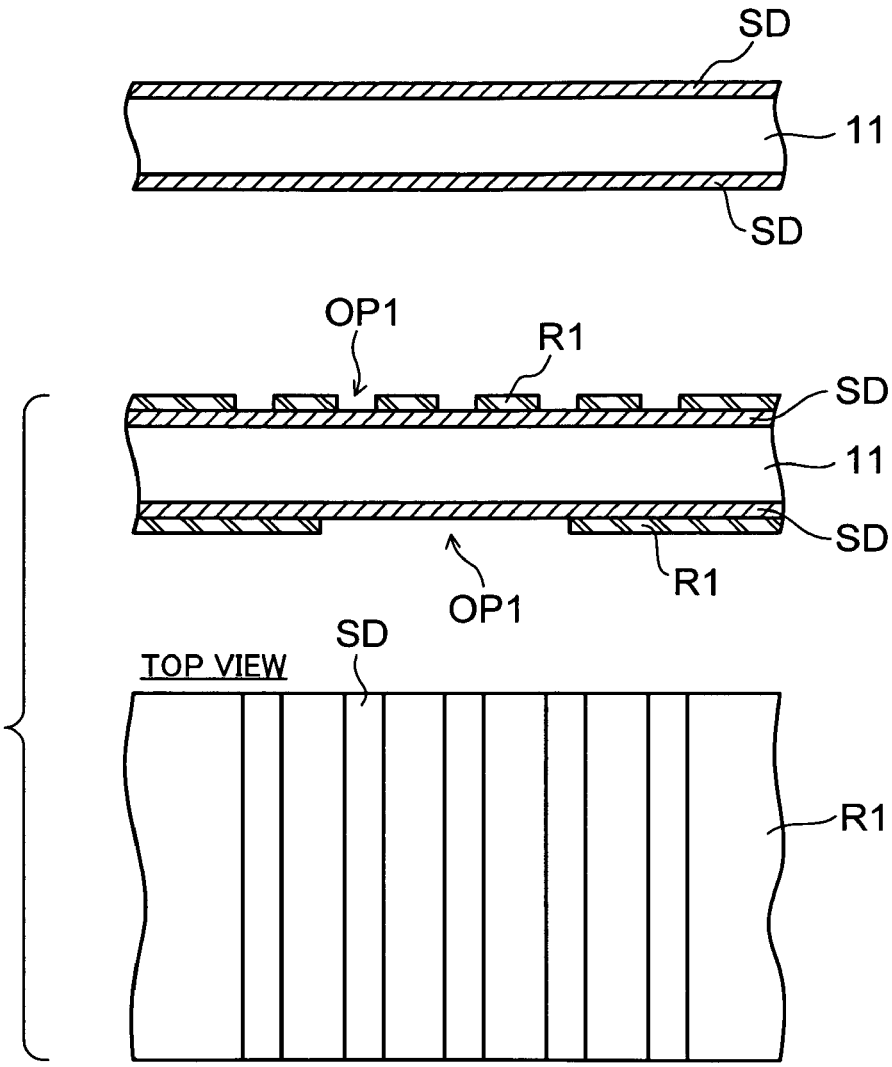

The resin substrate 11 in a desired form is prepared at the first step (FIG. 2A). As mentioned above, the resin substrate 11 can take any form, provided that the substrate has the conductor layers formed on at least the outermost layers, and that the conductor layers are electrically connected through the inside of the substrate. The resin substrate 11 has conductor layers SD formed on both sides, as shown in cross section in FIG. 2A, and the conductor layers SD are used as power feed layers (or seed layers) for electroplating, as will be described later. For example, a core board for general use in a build-up multilayer wiring board can be used for the resin substrate 11. A structure shown in FIG. 2A can be obtained by laminating a desired number of sheets of prepreg (e.g., adhesive sheets in half-cured, B-stage form, made of glass cloth impregnated with a thermosetting resin such as an epoxy resin, a polyimide resin, a bismaleimide triazine (BT) resin, or a polyphenylene ether (PPE) resin, with the glass cloth used as a reinforcement member), thereby obtaining the laminated prepreg (of, for example, about 60 µm thick); placing copper foil (of, for example, about 2 to 3 µm thick) on both sides of the prepreg; and applying heat and pressure to the resultant structure. In this case, the prepreg corresponds to the resin substrate 11, and the copper foil corresponds to the conductor layer SD.

At the next step (FIG. 2B), resists for plating are formed using a patterning material on the conductor layers SD on both sides of the resin substrate 11, and openings OP1 are formed in the resists at desired positions. The openings OP1 are formed by means of patterning according to the desired shapes of wiring patterns to be formed. A photosensitive dry film or a liquid photoresist can be used as the patterning material.

For example, where a dry film is used which has a structure in which a resist material is sandwiched between a cover sheet made of polyester and a separator sheet made of polyethylene, a patterned resist layer R1 is formed through the steps of: surface cleaning; pretreatment for lamination (i.e., separator sheet delamination); resist lamination in the air; exposure; cover sheet delamination; and development. Specifically, respective resist layers R1 can be formed by: first cleaning the surfaces of the conductor layers SD; then laminating the dry films (each having a thickness of about 25 µm) onto the conductor layers SD by means of thermocompression bonding; curing the dry films by subjecting the dry films to exposure under ultraviolet (UV) irradiation using masks (not shown) formed in the desired shapes of the wiring patterns by means of patterning; and further, etching away target areas using a predetermined developing solution (e.g., an organic-solvent-containing developing solution for a negative resist, or an alkali-base developing solution for a positive resist) (formation of the openings OP1). Likewise, where a liquid photoresist is used, the patterned resist layers R1 can be formed in the desired shapes through the steps of: surface cleaning; coating resist on the surfaces; drying; exposure; and development.

Figure 2C:
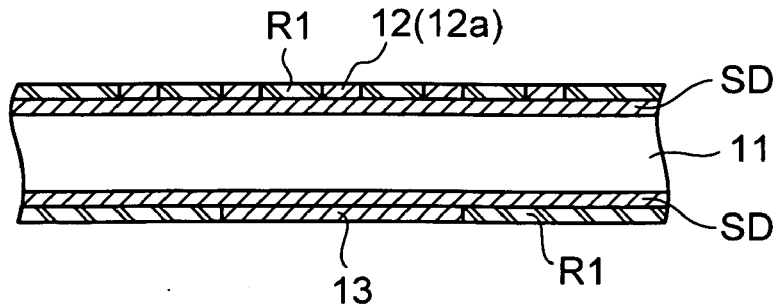

At the next step (FIG. 2C), thick wiring plating is performed to fill in the openings OP1, by means of copper (Cu) electroplating using as the power feed layers the seed layers (Cu) SD exposed from the openings OP1 in the resist layers R1. Areas given the thick wiring plating form the wiring layer 12 (wiring pattern 12a) and the wiring layer 13, respectively. Although the top surfaces of the formed wiring layers 12 and 13 are flat as shown in FIG. 2C, they are not necessarily limited to being flat. Therefore, a process for flattening the entire surface is desirably performed after the thick wiring plating. The flattening process also contributes to enhancement of adhesion to resists to be formed at the next step. Incidentally, the wiring layers 12 and 13 formed at the step of FIG. 2C are electrically interconnected via a through hole appropriately formed in the resin substrate 11 at a desired position, or via wiring layers appropriately formed in the substrate at desired positions and a via hole through which the wiring layers are interconnected, although not specifically shown.

Figure 3A:
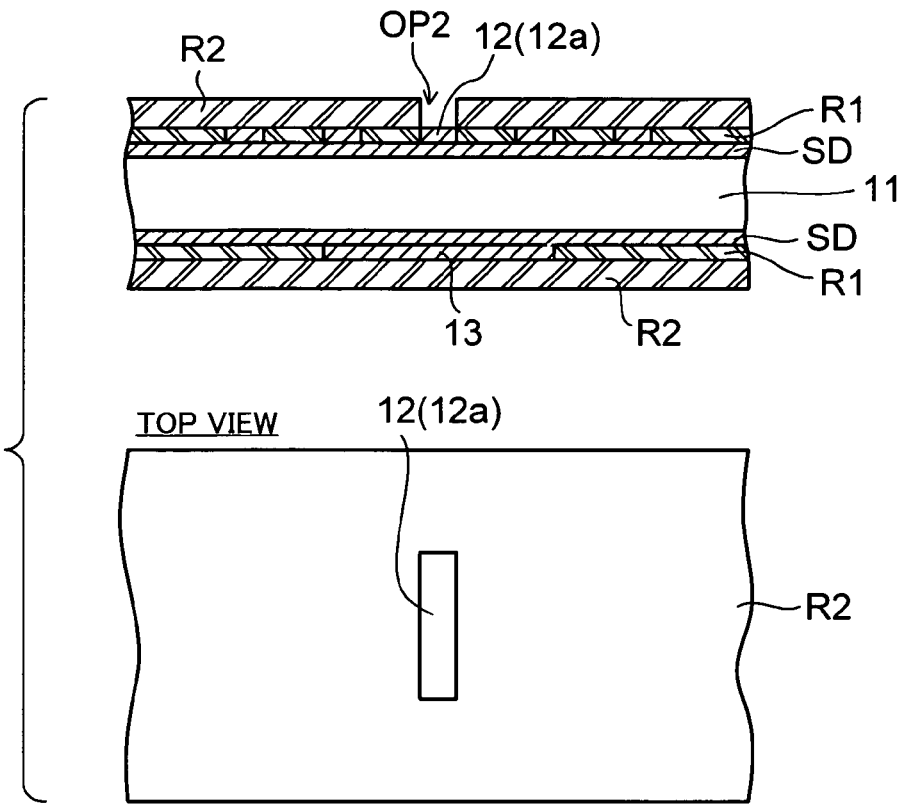
FIGS. 3A to 3C are cross-sectional views (partly in top view) showing steps following the steps shown in FIGS. 2A to 2C.
Figure 3B:
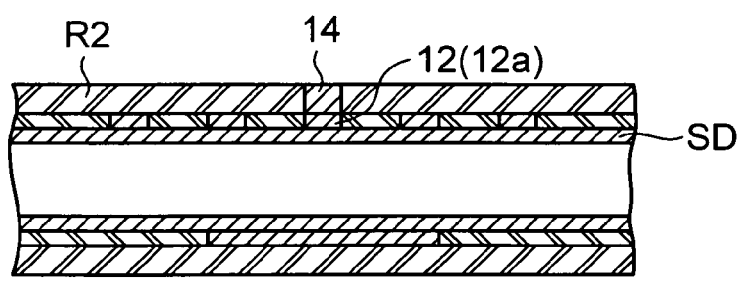

At the next step (FIG. 3A), resists for plating are further formed using a patterning material on the resist layers R1 and the wiring layers 12 and 13, with the resist layers R1 on both sides remaining as they are, and an opening OP2 is formed in one of the resists (e.g., the upper one as shown in FIG. 3A) at a desired position. The opening OP2 is formed by means of patterning according to the desired shape of the fin-shaped bump to be formed at the desired position on the wiring pattern 12a. Incidentally, the length of the fin-shaped bump to be formed (i.e., the length of the pattern having the "slender shape" as seen in plan view) is appropriately determined, allowing for misalignment, inaccuracy in fabrication, or the like, involved in the stacking of the boards. The same material as that for the resist layer R1 mentioned above (a photosensitive dry film or a liquid photoresist) or a different material can be used as the patterning material for resist formation. Resist patterning can take place in the same manner as the process performed at the step shown in FIG. 2B. Specifically, photolithography technology as mentioned above is used to etch away a target area in the resist (i.e., to form the opening OP2), thereby obtaining resist layers R2 according to the desired shapes of the fin-shaped bumps.

At the next step (FIG. 3B), the fin-shaped bump 14 is formed by performing thick plating to fill in the opening OP2 by means of copper (Cu) electroplating using as the power feed layer the wiring layer 12 (or the seed layer SD) exposed from the opening OP2 in the resist layer R2, in the same manner as the process performed at the step shown in FIG. 2C.

At the next step (FIG. 3C), pretreatment for providing a good electrical connection between the boards to be stacked at a later step takes place. In the pretreatment, the conductive material 15 is deposited on the top of the fin-shaped bump 14. In the embodiment, nickel (Ni) plating and gold (Au) plating are given in sequence on the top of the fin-shaped bump (Cu) 14 so as to form the conductor layer 15 of two-layer structure (Ni/Au).

At the next step (FIG. 4A), the lower wiring board 10 is fabricated. First, the resist layers R2 and R1 (FIG. 3C) are removed using an alkaline chemical solution such as sodium hydroxide or monoethanolamine-base solution. Thus the wiring layers 12 and 13 and the conductor layers (or seed layers) SD are exposed. Since under this condition the wiring layers 12 and 13 are electrically interconnected via the seed layers SD, pretreatment for the next step has to take place to remove the exposed seed layers SD alone. In this case, the exposed seed layers (Cu) SD are removed by wet etching using a chemical liquid soluble only in copper (Cu), using as masks the wiring layers 12 and 13 formed by patterning (as shown in FIG. 4A).

Incidentally, the wiring layers 12 and 13 are partially etched concurrently with the seed layers SD being etched, since the wiring layers 12 and 13 are made of the same material (Cu) as that for the seed layers SD. However, the wiring layers 12 and 13 are etched in minute amounts, which in turn do not seriously affect the substantial thicknesses of the wiring layers 12 and 13, because the thickness of each of the wiring layers 12 and 13 (e.g., about 25 μm) is considerably greater than the thickness of each of the seed layers SD (e.g., about 2 to 3 μm).

The above steps lead to fabrication of a structure (namely, the lower wiring board 10) having the wiring layer 12 (wiring pattern 12a) and the wiring layer 13 formed in the desired shapes on both sides of the resin substrate 11 by means of patterning, and the fin-shaped bump 14 (and the conductive material 15 on the top thereof) formed at the desired position on the wiring pattern 12a on one surface, as shown in FIG. 4A.

Further, the upper wiring board 20 to be stacked on the top of the lower wiring board 10 is fabricated in the same manner as the processes performed at the steps (FIGS. 2A to 4A) through which the lower wiring board 10 is fabricated. Specifically, there is fabricated a structure (namely, the upper wiring board 20) having the wiring layer 22 (wiring pattern 22a) and the wiring layer 23 formed in the desired shapes on both sides of the resin substrate 21 by means of patterning, and the fin-shaped bump 24 (and the conductive material 25 on the top thereof) formed at the desired position on the wiring pattern 22a on one surface, as shown in FIG. 4B. It is to be noted that the fabrication of the upper wiring board 20 requires appropriate alignment so that the fin-shaped bump 24 to be formed on the one surface is formed at such a position that, as seen in plan view, the fin-shaped bump 24 intersects the fin-shaped bump 14 of the lower wiring board 10 crosswise at the wiring pattern 22a on the surface facing the lower wiring board 10 when the upper wiring board 20 is stacked on the top of the lower wiring board 10.

Figure 5A:
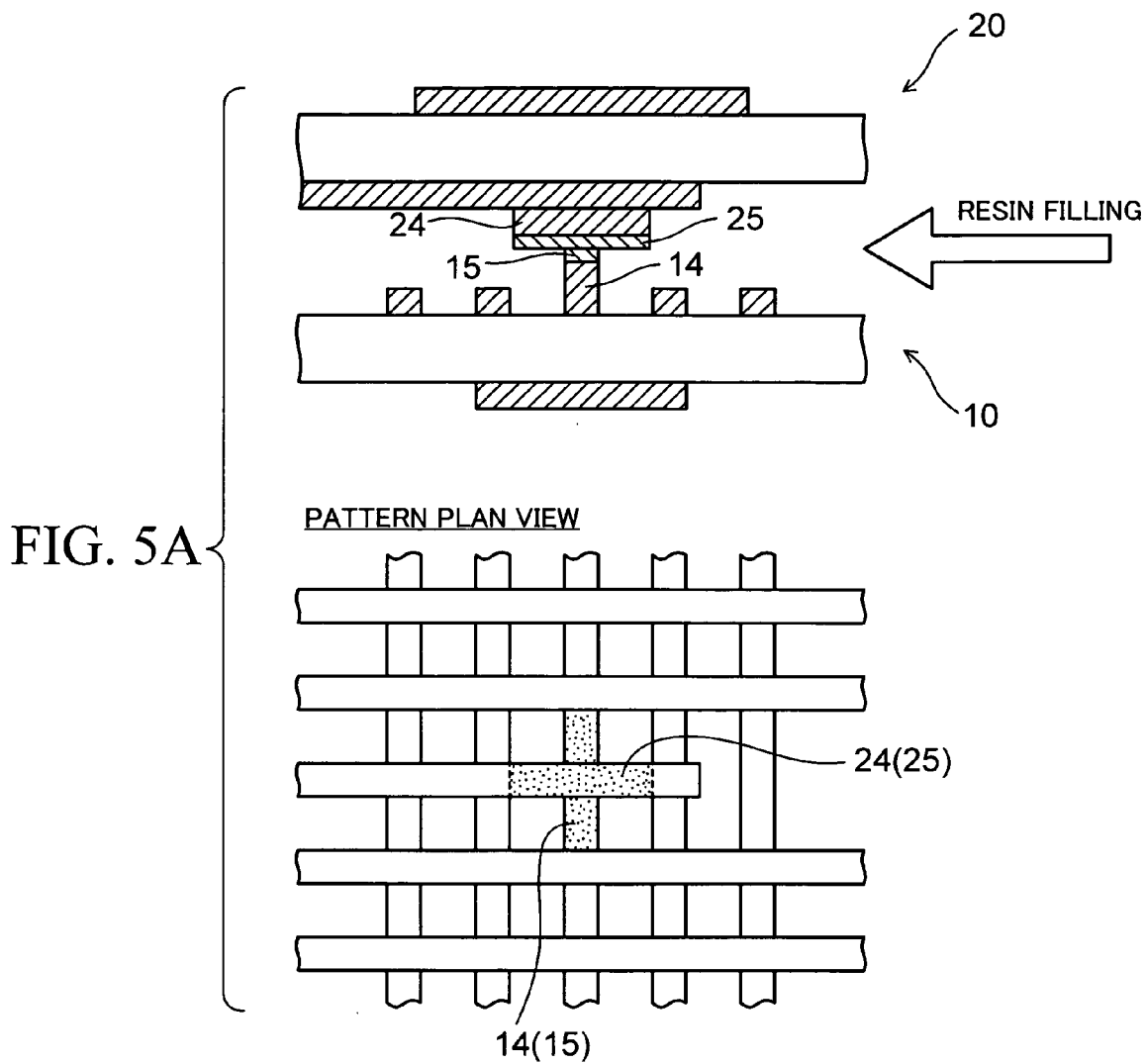
FIGS. 5A and 5B are cross-sectional views (partly in plan view) showing steps following the steps shown in FIGS. 4A and 4B.

At the next step (FIG. 5A), the lower wiring board 10 and the upper wiring board 20 fabricated through the above steps are first stacked up. Specifically, the lower wiring board 10 and the upper wiring board 20 are stacked up, as positioned so that the fin-shaped bump 14 (and the conductive material 15) of the lower wiring board 10 and the fin-shaped bump 24 (and the conductive material 25) of the upper wiring board 20 intersect each other crosswise as seen in plan view, as shown in FIG. 5A. "Pin lamination" is used for this stacking. This method is to pin the relative positions of the boards by inserting guide pins into reference holes for alignment previously formed in the peripheries of the boards at desired positions.

Also, ultrasonic bonding can be used to provide an electrical connection between the fin-shaped bumps 14 and 24 (and between the conductive materials 15 and 25). This bonding involves applying ultrasonic vibrations to the surfaces (Au) of the conductive materials 15 and 25 on the bumps 14 and 24 used as bonding base members, thereby producing friction on a contact surface therebetween; and melting the conductive materials 15 and 25 by frictional heat produced by the friction, thereby providing bonding between the bumps 14 and 24. Thus, the bumps 14 and 24 are electrically connected to form the cross post section CP (FIGS. 1A and 1B). In other words, the two wiring boards 10 and 20 are electrically connected via the cross post section CP.

Further, resin is filled into a gap between the stacked wiring boards 10 and 20. Resin filling is for the purpose of imparting strength to the board of multilayer structure and thereby preventing the occurrence of warpage.

A thermoplastic epoxy resin for general use in a molding resin, a liquid epoxy resin for general use in an underfill resin, or the like, is used as a material for the filling resin. The thermoplastic epoxy resin has a modulus of elasticity of 15 to 30 GPa and a coefficient of thermal expansion (CTE) of 5 to 15 ppm per degree. Further, this resin contains about 70% to 90% of a filler added thereto (e.g., fine particles of inorganic matter such as silica, alumina, or calcium silicate) in order to control the modulus of elasticity, the CTE and so on, of the resin. The liquid epoxy resin has a modulus of elasticity of 5 to 15 GPa and a CTE of 20 to 40 ppm per degree and contains about 60% to 80% of a filler added thereto. Preferably, transfer molding can be used as a resin filling method. Besides the transfer molding, injection molding, underfill flow molding, or other methods may be used for the resin filling.

The above steps lead to fabrication of a structure formed of a stack of the lower wiring board 10 and the upper wiring board 20 in electrically connected relationship, having a resin layer (the insulating layer 30 shown in FIG. 5B) formed to fill in between the stacked boards 10 and 20, as shown in FIG. 5A.

At the final step (FIG. 5B), solder resist layers (the insulating layers 31 and 32) functioning as protection films are formed on the outermost layers of the resultant structure (i.e., on the top and bottom of the structure). The solder resist layers 31 and 32 can be formed in the same manner as the process performed at the step shown in FIG. 2B or the step shown in FIG. 3A. Specifically, the formation of the solder resist layers 31 and 32 can be accomplished by laminating photosensitive dry films onto the resin substrates 11 and 21 and the wiring layers 13 and 23 (or by applying coatings of liquid photoresist thereto), and forming the resists in desired shapes (specifically, the shapes except the pad areas defined at the predetermined positions on the wiring layers 13 and 23) by means of patterning.

The above steps lead to fabrication of the multilayer wiring board 40 according to the embodiment (FIGS. 1A and 1B).

As described above, according to the multilayer wiring board (FIGS. 1A and 1B) and the method of manufacturing the same (FIGS. 2A to 5B) according to the embodiment, when stacking a plurality of wiring boards (e.g., the lower wiring board 10 and the upper wiring board 20), the fin-shaped bumps 14 and 24 which are formed on the surfaces facing each other, of the wiring boards 10 and 20, respectively, are bonded together in overlapping relationship in such a manner as to intersect each other crosswise as seen in plan view, to thereby form an integral structure of the bumps (namely, the cross post section CP), which in turn is used to provide an electrical connection between the boards 10 and 20 therethrough. In short, the cross post section CP (formed of a pair of the fin-shaped bumps 14 and 24) is used as means for providing an interconnection between the boards.

Figure 7A:
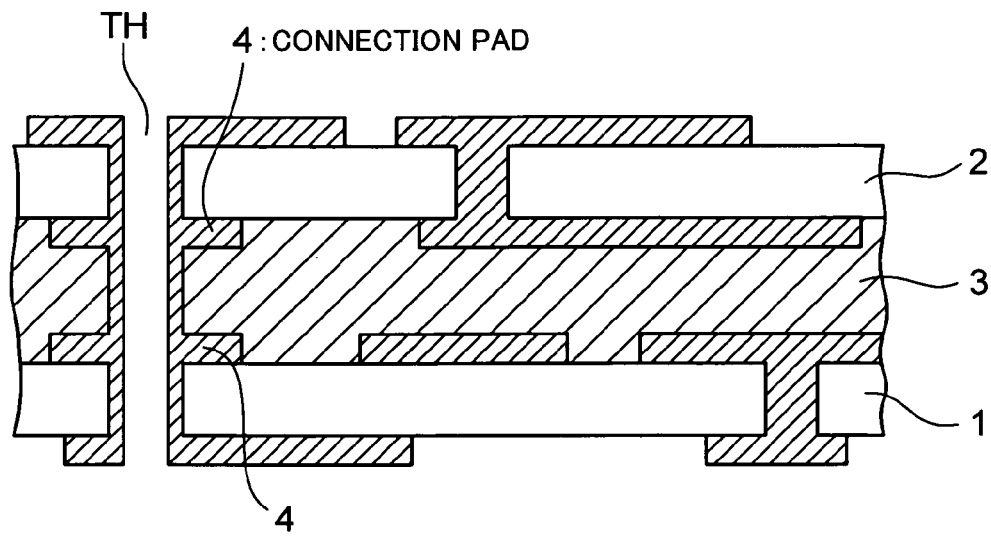
FIGS. 7A and 7B are views for explaining an interconnection between boards in the prior art multilayer wiring board.
Figure 7B:
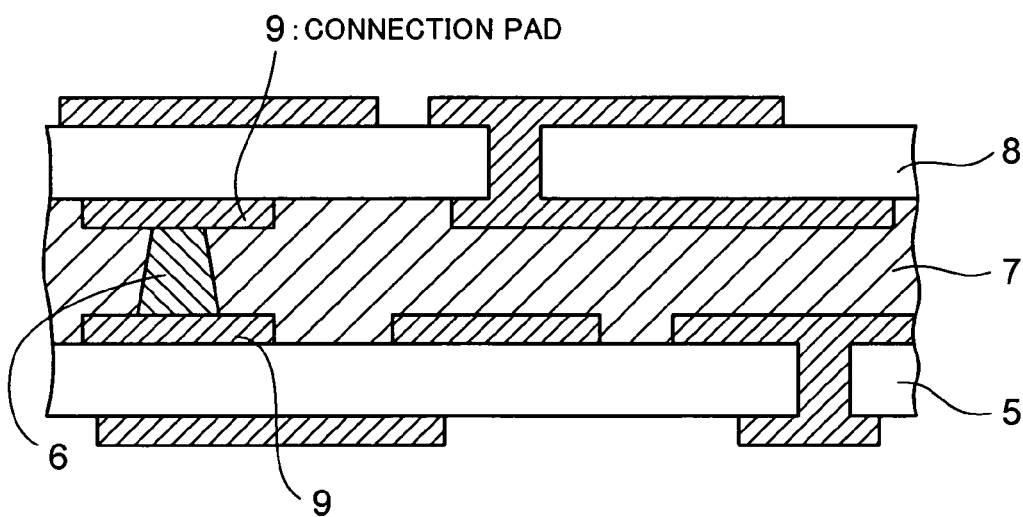
Figure 8:
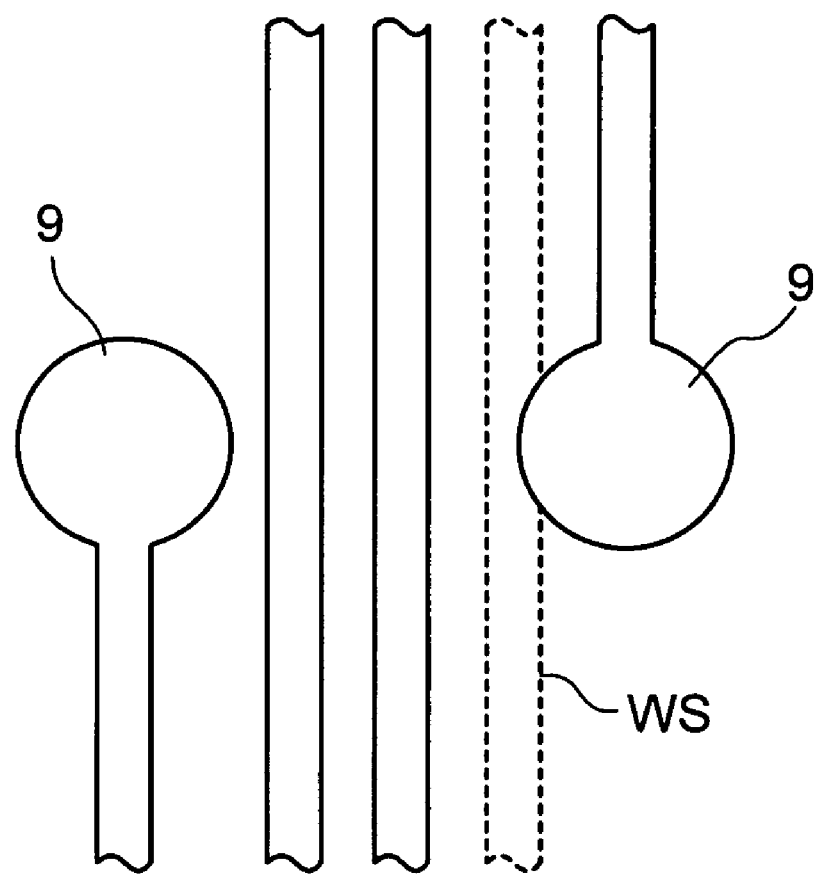
FIG. 8 is a view for explaining a problem caused by the prior art interconnection between the boards.

The above configuration eliminates the need for the circular connection pads 4 and 9 (FIGS. 7A and 7B) required for the interconnection between the boards as seen in the prior art, and hence enables eliminating a disadvantage (specifically, incapability of wiring routing) as encountered in the prior art (FIG. 8). In other words, this configuration (FIGS. 1A and 1B) can contribute to achievement of high-density wiring, because of making it possible to route wiring patterns 12b and 12c closely adjacent to the bump 14 (wiring pattern 12a) in the lower wiring board 10.

Figure 6:
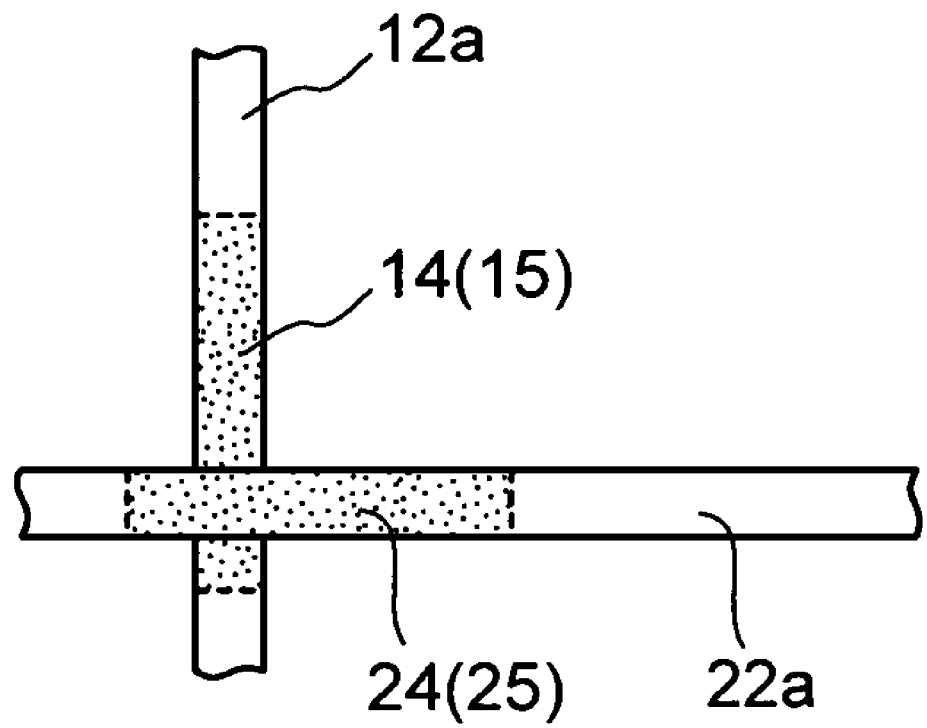
FIG. 6 is a view for explaining an advantageous effect achieved by the multilayer wiring board shown in FIGS. 1A and 1B.

Moreover, the fin-shaped bumps 14 and 24 that form the inter-board connection terminal (i.e., the cross post section CP) overlap each other in such a manner as to intersect each other crosswise. This makes it possible to ensure an electrical connection between the wiring patterns 12a and 22a of the boards via the fin-shaped bumps 14 and 24 (and via the conductive materials 15 and 25) as shown in FIG. 6, even at occurrence of some misalignment or inaccuracy in fabrication or the like when stacked.

Figure 5B:
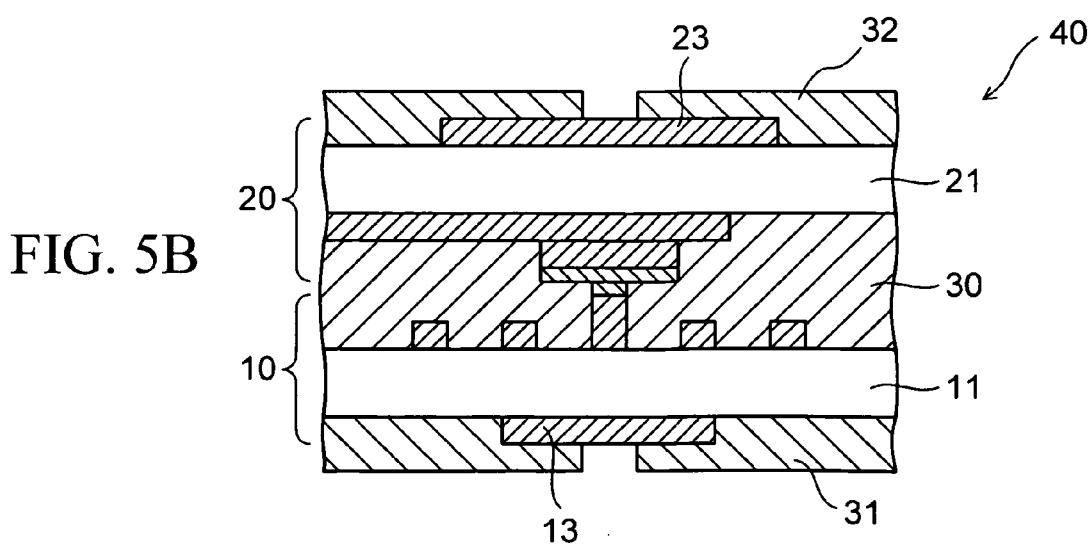

For the embodiment mentioned above, description has been given taking the case where when stacking the lower wiring board 10 and the upper wiring board 20, the resin is filled into the gap between the boards 10 and 20 to form the insulating layer 30 (FIGS. 5A and 5B). However, it is to be, of course, understood that the insulating layer 30 is not limited to taking this form. For example, the approach of interposing prepreg between the lower wiring board 10 and the upper wiring board 20 may be adopted in place of the resin filling. In this case, the formation of the insulating layer can be accomplished by collectively stacking up the boards 10 and 20 with the prepreg being interposed between the boards 10 and 20, and subjecting a resultant stack to application of pressure (i.e., pressing) or application of heat and pressure (i.e., hot pressing) both on the top of and on the bottom of the stack. In this case, the fin-shaped bumps 14 and 24 are connected by being penetrated through the prepreg layer. It is to be noted in this respect that a conductive bump for general use in the art is of truncated-cone shape, whereas the fin-shaped bumps 14 and 24 as employed in the embodiment are of the "slender shape" in cross section, and due to this form, when performing the above-mentioned collective stacking, such a situation can possibly arise as the fin-shaped bumps 14 and 24 do not necessarily project through the prepreg layer, depending on conditions of the application of heat and pressure, and so on. Consequently, the adoption of the resin filling approach or the prepreg interposing approach must be appropriately selected, giving a full consideration to process conditions and so on.

For the embodiment mentioned above, description has been given taking the case where the conductor layers of Ni/Au are formed as the conductive materials 15 and 25 on the tops of the fin-shaped bumps 14 and 24, and the ultrasonic bonding is used to provide the electrical connection between the bumps (i.e., between the boards 10 and 20). However, it is to be, of course, understood that the connection between the boards is not limited to taking this form. For example, solder may be used as the conductive materials 15 and 25 to provide the connection between the boards therethrough. One method for this is to form adhesive layers on the surfaces of targets for deposition (in this case, the tops of the fin-shaped bumps 14 and 24); deposit solder powder (made of a solder alloy of lead-free (Pb-free) composition, such as a tin-silver (Sn—Ag) base or tin-zinc (Sn—Zn) base alloy) on the bumps; and melt the solder powder by reflow when stacking the boards 10 and 20, thereby providing the bonding between the bumps 14 and 24.

Besides the above method, screen printing method or the like, for example, may be used. Specifically, this method involves feeding solder paste onto the targets for deposition, and melting the solder paste by heat when stacking the boards 10 and 20, thereby providing the bonding between the bumps 14 and 24. Alternatively, solder electroplating may be used to deposit solder.

Figure 3C:
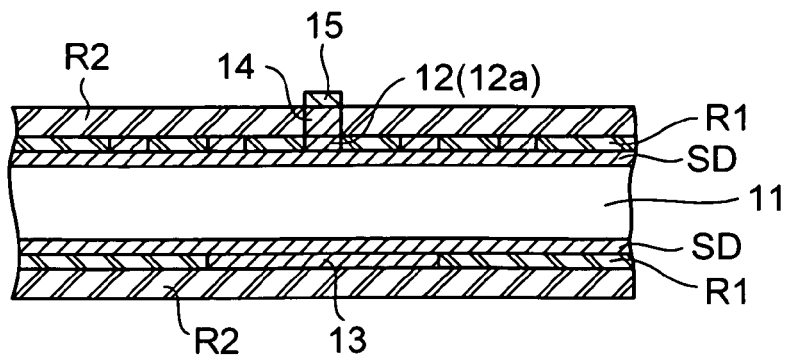

A method of providing the connection between the bumps 14 and 24 without the use of the conductive materials 15 and 25 such as the Ni/Au plating or the solder mentioned above may be also used. With this method, the above-mentioned step shown in FIG. 3C is omitted. For example, this method may involve temporarily press-bonding the tops of the bumps (Cu) 14 and 24 by pressing or the like, with the bumps 14 and 24 being positioned to intersect each other crosswise, when stacking the boards 10 and 20; and then performing Cu electroplating, thereby providing tight bonding (or electrical connection) between the bumps 14 and 24.

For the embodiment mentioned above, description has been given taking the case where the insulating layer 30 alone, such as the resin or the prepreg, is interposed between the stacked wiring boards 10 and 20. However, a semiconductor (e.g., silicon) device, a chip component such as a capacitor, a resistor, an inductor, or the like, may be buried in the gap between the wiring boards, as needed.

What is claimed is:
1. A multilayer wiring board, comprising:
   at least two wiring boards stacked up;
   a pair of fin-shaped bumps formed at desired positions on wiring patterns on the surfaces facing each other, of the wiring boards, in such a manner that each bump assumes a slender shape in relation to a length of each bump as seen in plan view, and that the bumps intersect each other, the pair of fin-shaped bumps being electrically connected to form an inter-board connection terminal; and an insulating layer formed between the wiring boards, wherein each fin-shaped bump is connected along its entire length to the wiring pattern.

2. The multilayer wiring board according to claim 1, further comprising a protection film formed to cover the entire surface except a pad area defined at a predetermined position on the outermost wiring layer.

3. The multilayer wiring board according to claim 1, wherein a conductive material is deposited on the top of each of the pair of fin-shaped bumps, and the pair of fin-shaped bumps are electrically connected via the respective conductive materials.

4. The multilayer wiring board according to claim 1, wherein the pair of fin-shaped bumps are formed to intersect each other in the shape of a cross.

* * * * *